United States Patent
Yoon et al.

(10) Patent No.: US 8,263,321 B2
(45) Date of Patent: Sep. 11, 2012

(54) POLYMER HAVING ANTIREFLECTIVE PROPERTIES AND HIGH CARBON CONTENT, HARDMASK COMPOSITION INCLUDING THE SAME, AND PROCESS FOR FORMING A PATTERNED MATERIAL LAYER

(75) Inventors: Kyong Ho Yoon, Daejeon-si (KR); Jong Seob Kim, Daejeon-si (KR); Dong Seon Uh, Seoul (KR); Chang Il Oh, Seongnam-si (KR); Kyung Hee Hyung, Seongnam-si (KR); Min Soo Kim, Incheon-si (KR); Jin Kuk Lee, Gunpo-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 12/929,072

(22) Filed: Dec. 29, 2010

(65) Prior Publication Data

US 2011/0097672 A1     Apr. 28, 2011

Related U.S. Application Data

(63) Continuation of application No. 12/003,732, filed on Dec. 31, 2007, now Pat. No. 7,862,990.

(30) Foreign Application Priority Data

Dec. 30, 2006 (KR) .......... 10-2006-0139169

(51) Int. Cl.
*G03F 7/40* (2006.01)
*C08G 61/12* (2006.01)
*C08L 65/00* (2006.01)

(52) U.S. Cl. ............ 430/323; 528/171; 430/271.1; 430/313; 430/316

(58) Field of Classification Search .............. None
See application file for complete search history.

(56) References Cited

U.S. PATENT DOCUMENTS

| | | |
|---|---|---|
| 2004/0259037 A1 | 12/2004 | Hatakeyama et al. |
| 2006/0019195 A1 | 1/2006 | Hatakeyama et al. |
| 2006/0204891 A1 | 9/2006 | Hatakeyama |
| 2006/0234158 A1 | 10/2006 | Hatakeyama |
| 2006/0251990 A1 | 11/2006 | Uh et al. |
| 2008/0160460 A1 | 7/2008 | Yoon et al. |
| 2009/0098486 A1 | 4/2009 | Yoshimura et al. |

FOREIGN PATENT DOCUMENTS

WO    WO 2007/105776 A1    9/2007

*Primary Examiner* — Cynthia Hamilton
(74) *Attorney, Agent, or Firm* — Lee & Morse, P.C.

(57) ABSTRACT

An antireflective hardmask composition includes an organic solvent, an initiator, and at least one polymer represented by Formulae A, B, or C as set forth in the specification.

10 Claims, 2 Drawing Sheets

POLYMER HAVING ANTIREFLECTIVE PROPERTIES AND HIGH CARBON CONTENT, HARDMASK COMPOSITION INCLUDING THE SAME, AND PROCESS FOR FORMING A PATTERNED MATERIAL LAYER

CROSS REFERENCE TO RELATED APPLICATION

This is a continuation application based on pending application Ser. No. 12/003,732, filed Dec. 31, 2007, now U.S. Pat. No. 7,862,990 the entire contents of which is hereby incorporated by reference.

BACKGROUND OF THE INVENTION

1. Field of the Invention

Embodiments relate to a polymer having antireflective properties and high carbon content, a hardmask composition including the same, a process for forming a patterned material layer, and an associated device.

2. Description of the Related Art

Antireflective coating (ARC) materials may be incorporated in an imaging layer used during a lithographic process, in order to minimize reflectivity between the imaging layer and a target material layer during fabrication of a device. However, where the imaging layer incorporating ARC materials and the target material layer have similar compositions, the imaging layer may exhibit poor etch selectivity, such that portions of the imaging layer may be consumed during etching of the target material layer. Accordingly, a hardmask may be included as an intermediate layer, the hardmask being disposed between the imaging layer and the target material layer. The hardmask may receive a pattern from the overlying imaging layer, and may be used to transfer the pattern to the underlying material layer. However, there is a need for hardmask materials that exhibit antireflective properties.

SUMMARY OF THE INVENTION

Embodiments are therefore directed to a polymer having antireflective properties and high carbon content, a hardmask composition including the same, a process for forming a patterned material layer, and an associated device, which substantially overcome one or more of the problems due to the limitations and disadvantages of the related art.

It is therefore a feature of an embodiment to provide a polymer having aromatic ring-containing groups in the backbone and a high carbon content.

It is therefore another feature of an embodiment to provide an antireflective hardmask composition including the polymer.

It is therefore another feature of an embodiment to provide a process of fabricating a device using an antireflective hardmask composition, and a device formed using the hardmask composition.

At least one of the above and other features and advantages may be realized by providing a bis(phenyl)fluorene-backbone polymer represented by Formula A:

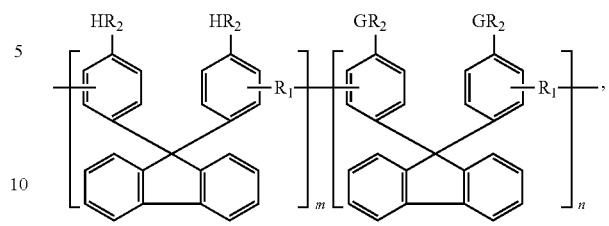

The fluorene group may be unsubstituted or substituted, m may be at least 1 and less than about 750, n may be at least 1 and less than about 750, $R_1$ may be methylene or may include a non-fluorene-containing aryl linking group, $R_2$ may be oxygen or an alkoxy group having from 1 to about 7 carbons in which the alkoxy oxygen is bonded to the hydrogen H or the group G, and G may be vinyl or allyl.

The fluorene group may be substituted, such that Formula A is represented by Formula 1:

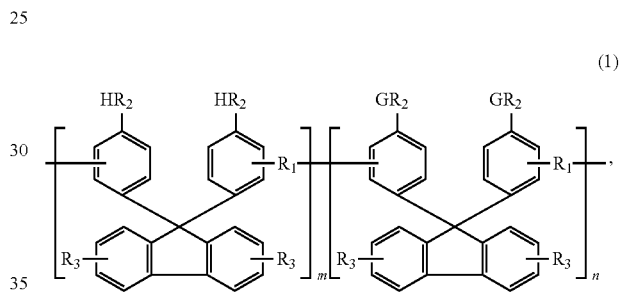

$R_3$ may be a hydroxyl, a hydrocarbon of about 10 carbons or less, or a halogen. $R_3$ may be the hydrocarbon of about 10 carbons or less, and the hydrocarbon of about 10 carbons or less may include a $C_1$-$C_{10}$ alkyl group, a $C_6$-$C_{10}$ aryl group, or an allyl group. $R_1$ may be

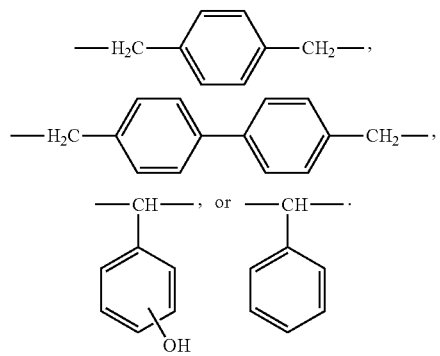

The polymer may have a weight average molecular weight of about 1,000 to about 30,000.

At least one of the above and other features and advantages may also be realized by providing a naphthalene-backbone polymer represented by Formula B:

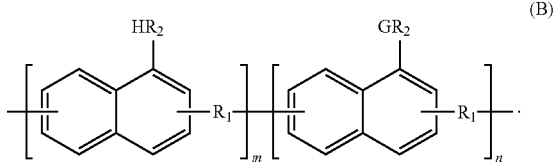

(B)

The naphthalene group may be unsubstituted or substituted, m may be at least 1 and less than about 750, n may be at least 1 and less than about 750, $R_1$ may be methylene or may include a non-naphthalene-containing aryl linking group, $R_2$ may be oxygen or an alkoxy group having from 1 to about 7 carbons in which the alkoxy oxygen is bonded to the hydrogen H or the group G, and G may be vinyl or allyl.

The naphthalene group may be substituted, such that Formula A is represented by Formula 2:

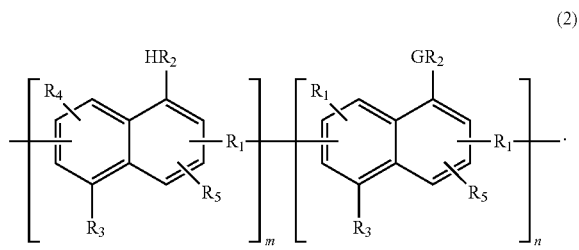

(2)

$R_3$, $R_4$, and $R_5$ may each independently be a hydrogen, a hydroxyl, a hydrocarbon of about 10 carbons or less, or a halogen, and at least one of $R_3$, $R_4$, and $R_5$ may not be hydrogen. At least one of $R_3$, $R_4$, and $R_5$ may be the hydrocarbon of about 10 carbons or less, and the hydrocarbon of about 10 carbons or less may include a $C_1$-$C_{10}$ alkyl group, a $C_6$-$C_{10}$ aryl group, or an allyl group. $R_1$ may be

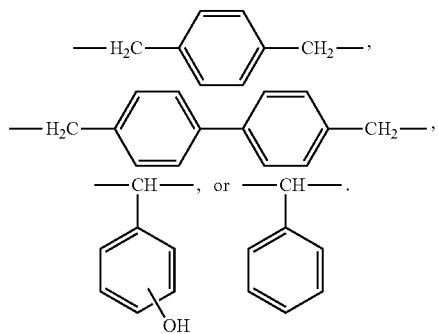

The polymer may have a weight average molecular weight of about 1,000 to about 30,000.

At least one of the above and other features and advantages may also be realized by providing a pyrene-backbone polymer represented by Formula C:

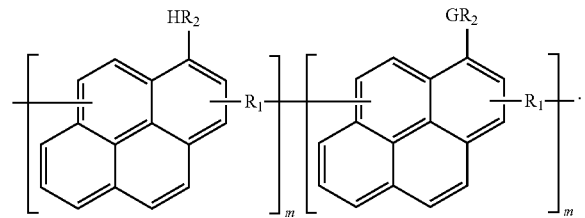

(C)

The pyrene group may be unsubstituted or substituted, may be at least 1 and less than about 750, n may be at least 1 and is less than about 750, $R_1$ may be methylene or may include a non-pyrene-containing aryl linking group, $R_2$ may be oxygen or an alkoxy group having from 1 to about 7 carbons in which the alkoxy oxygen is bonded to the hydrogen H or the group G, and G may be vinyl or allyl.

The pyrene group may be substituted, such that Formula C is represented by Formula 3:

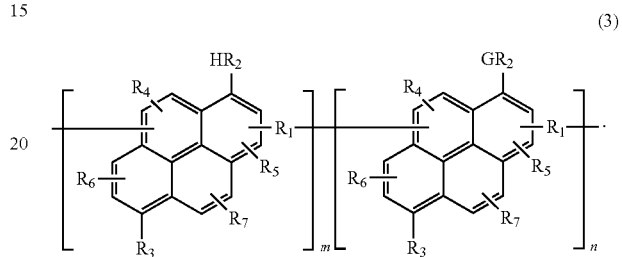

(3)

$R_3$, $R_4$, $R_5$, $R_6$, and $R_7$ may each independently be a hydrogen, a hydroxyl, a hydrocarbon of about 10 carbons or less, or a halogen, and at least one of $R_3$, $R_4$, $R_5$, $R_6$, and $R_7$ may not be hydrogen. At least one of $R_3$, $R_4$, $R_5$, $R_6$, and $R_7$ may be the hydrocarbon of about 10 carbons or less, and the hydrocarbon of about 10 carbons or less may include a $C_1$-$C_{10}$ alkyl group, a $C_6$-$C_{10}$ aryl group, or an allyl group. $R_1$ may be

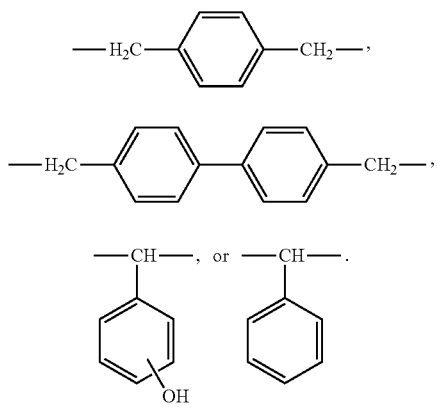

The polymer may have a weight average molecular weight of about 1,000 to about 30,000.

At least one of the above and other features and advantages may also be realized by providing an antireflective hardmask composition, including an organic solvent, an initiator, and at least one polymer represented by Formulae A, B, or C:

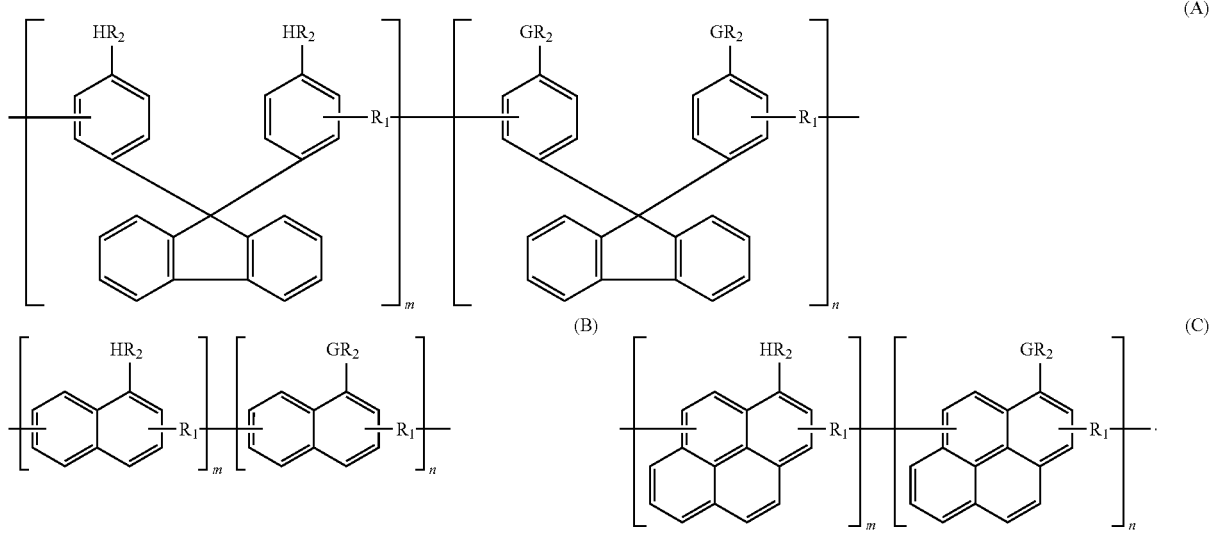

In Formula A, the fluorene group may be unsubstituted or substituted, in Formula B, the naphthalene group may be unsubstituted or substituted, and in Formula C, the pyrene group may be unsubstituted or substituted. In all of Formulae A, B, or C, m may be at least 1 and less than about 750, n may be at least 1 and less than about 750, $R_1$ may be methylene or may include an aryl linking group, $R_2$ may be oxygen or an alkoxy group having from 1 to about 7 carbons in which the alkoxy oxygen is bonded to the hydrogen H or the group G, and G may be vinyl or allyl.

The composition may include about 1 part to about 30 parts by weight of the at least one polymer, based on 100 parts by weight of the organic solvent. The composition may further include a crosslinker and a catalyst. About 1% to about 20% of the weight of the composition may be the at least one polymer, about 0.001% to about 5% of the weight of the composition may be the initiator, about 75% to about 98.8% of the weight of the composition may be the organic solvent, about 0.1% to about 5% of the weight of the composition may be the crosslinker, and about 0.001% to about 0.05% of the weight of the composition may be the catalyst. The composition may further include a crosslinker, and the crosslinker may include one or more of an etherified amino resin, an N-methoxymethyl-melamine resin, an N-butoxymethyl-melamine resin, a methylated urea resin, a butylated urea resin, a glycoluril derivative, a 2,6-bis(hydroxymethyl)-p-cresol compound, or a bisepoxy compound.

At least one of the above and other features and advantages may also be realized by providing a process of patterning a material layer, the process including forming a hardmask layer on the material layer using the composition according to an embodiment, forming a radiation-sensitive imaging layer on the hardmask layer, patternwise exposing the imaging layer to radiation to form a pattern of radiation-exposed regions in the imaging layer, selectively removing portions of the imaging layer and the hardmask layer to expose portions of the material layer, and etching the portions of the material layer that are exposed through openings in the hardmask layer.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Figure 1A:
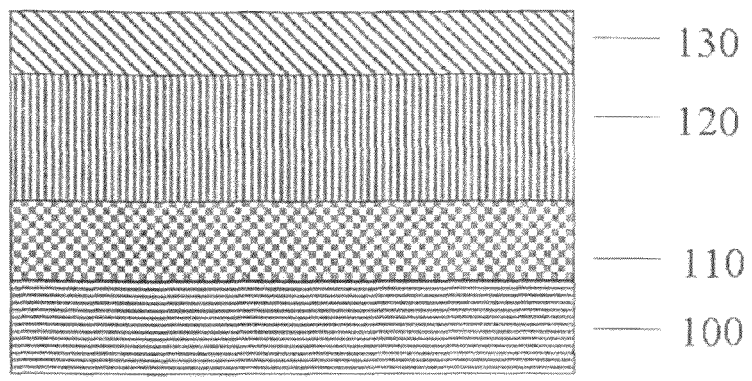
FIGS. 1A-1E illustrate stages in a method of fabricating a device using a hardmask composition according to an embodiment.

Korean Patent Application No. 10-2006-0139169, filed on Dec. 30, 2006, in the Korean Intellectual Property Office, and entitled: "High Etch Resistant Hardmask Composition Having Antireflective Properties with High Carbon Content and Method for Forming Patterned Material Layer Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a catalyst" may represent a single compound, e.g., pyridinium p-toluenesulfonate, or multiple compounds in combination, e.g., pyridinium p-toluenesulfonate mixed with p-toluenesulfonic acid monohydrate.

As used herein, molecular weights of polymeric materials are weight average molecular weights, unless otherwise indicated.

Exemplary embodiments will now be described in greater detail. Embodiments may provide high-density networking polymer with high carbon content in an amorphous structure, which may be suitable for forming a hardmask having an anisotropic profile. Embodiments may also provide aromatic ring-containing polymers with aromatic rings that have a strong absorption in the short wavelength region, e.g., 157 nm, 193 nm, and 248 nm. The polymers may have the aromatic rings in the backbone of the polymer, and may have reactive groups where crosslinking can occur between adjacent polymer molecules.

An embodiment provides a polymer represented by Formula A:

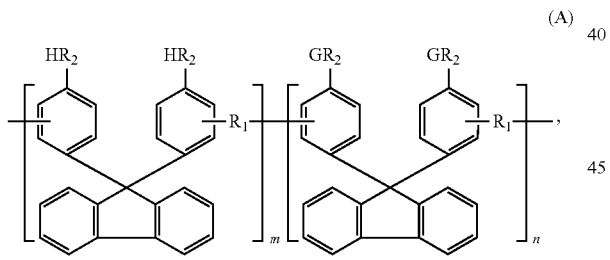

(A)

In Formula A, $R_1$ may be methylene or may include a non-fluorene-containing aryl linking group, e.g.,

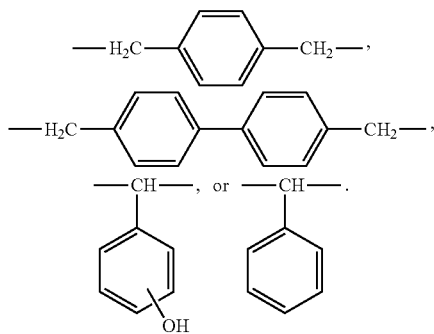

$R_2$ may be an oxygen (—O—) or an alkoxy group having from 1 to about 7 carbons (—$C_nH_{2n}$O—, where n is an integer from 1 to about 7 and 2n represents twice the number of carbons) in which the alkoxy carbon is bonded to the backbone of the polymer and the alkoxy oxygen is bonded to the group G, and $HR_2$ may be the corresponding hydroxyl or alcohol. G may be a reactive group capable of crosslinking with an adjacent polymer molecule. For example, G may be an unsaturated hydrocarbon group (alkene) such as vinyl (—CH=$CH_2$) or allyl (—$CH_2$—CH=$CH_2$), in which the unsaturation is at a terminal position. A partial structure showing the case is which G is allyl is shown below:

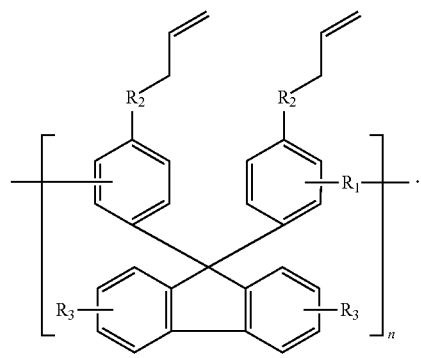

The numbers represented by m and n may be as follows: m may be at least 1 and less than about 750, and n may be at least 1 and less than about 750.

Formula A may be unsubstituted or substituted, e.g., the fluorene group in Formula A may be substituted. In an implementation, the fluorene group may be substituted with a group $R_3$, as shown in Formula 1.

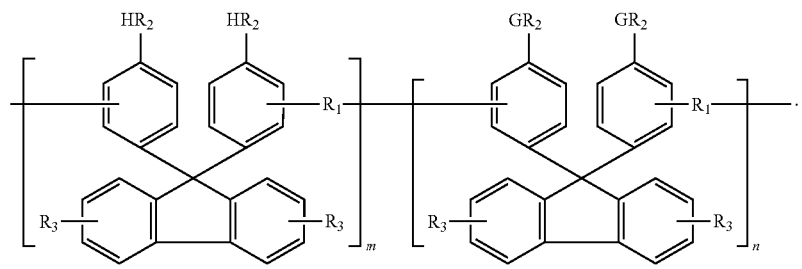

(1)

In Formula 1, $R_3$ may be a hydroxyl, a halogen, or a hydrocarbon of about 10 carbons or less. The hydrocarbon of about 10 carbons or less may include, e.g., a $C_1$-$C_{10}$ alkyl group, a $C_6$-$C_{10}$ aryl group, or an allyl group.

A second embodiment provides a polymer represented by Formula B:

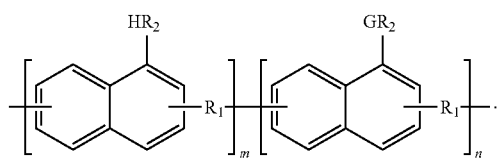

(B)

In Formula B, $R_1$, $R_2$, G, m, and n may be as described in connection with Formula A, i.e., $R_1$ may be methylene or may include a non-naphthalene-containing aryl linking group, e.g.,

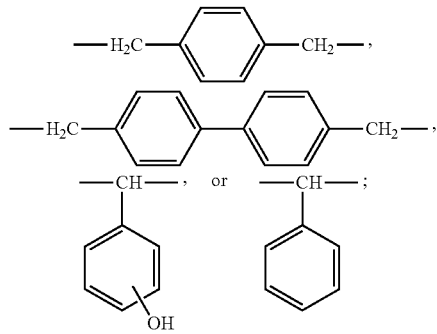

$R_2$ may be an oxygen (—O—) or an alkoxy group having from 1 to about 7 carbons (—$C_nH_{2n}O$—, where n is an integer from 1 to about 7 and 2n represents twice the number of carbons) in which the alkoxy carbon is bonded to the backbone of the polymer and the alkoxy oxygen is bonded to the group G, and $HR_2$ may be the corresponding hydroxyl or alcohol; and G may be a reactive group capable of crosslinking with an adjacent polymer molecule. For example, G may be an unsaturated hydrocarbon group (alkene) such as vinyl (—CH=$CH_2$) or allyl (—$CH_2$—CH=$CH_2$), in which the unsaturation is at a terminal position. A partial structure showing the case is which G is allyl is shown below:

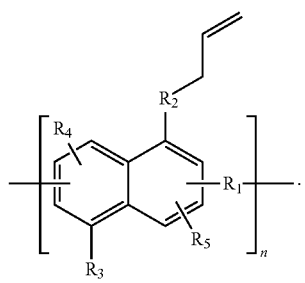

The numbers represented by m and n may be as follows: m may be at least 1 and less than about 750, and n may be at least 1 and less than about 750.

Formula B may be unsubstituted or substituted, e.g., the naphthalene group in Formula B may be substituted. In an implementation, the naphthalene group may be substituted with one or more of groups $R_3$, $R_4$, and $R_5$, as shown in Formula 2.

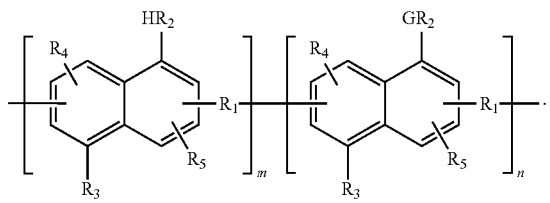

(2)

In Formula 2, $R_3$ may be as described in connection with Formula 1, i.e., $R_3$ may be a hydroxyl, a halogen, or a hydrocarbon of about 10 carbons or less. The hydrocarbon of about 10 carbons or less may include, e.g., a $C_1$-$C_{10}$ alkyl group, a $C_6$-$C_{10}$ aryl group, or an allyl group. The group $R_4$ may also be a hydroxyl, a halogen, or a hydrocarbon of about 10 carbons or less, and the hydrocarbon of about 10 carbons or less may include, e.g., a $C_1$-$C_{10}$ alkyl group, a $C_6$-$C_{10}$ aryl group, or an allyl group. The group $R_5$ may also be a hydroxyl, a halogen, or a hydrocarbon of about 10 carbons or less, and the hydrocarbon of about 10 carbons or less may include, e.g., a $C_1$-$C_{10}$ alkyl group, a $C_6$-$C_{10}$ aryl group, or an allyl group. That is, $R_3$, $R_4$, and $R_5$ may each independently be a hydroxyl, a halogen, or a hydrocarbon of about 10 carbons or less, and the hydrocarbon of about 10 carbons or less may include, e.g., a $C_1$-$C_{10}$ alkyl group, a $C_6$-$C_{10}$ aryl group, or an allyl group. Further, one or more of $R_3$, $R_4$, and $R_5$ may be hydrogen, i.e., substitution at all of $R_3$, $R_4$, and $R_5$ is not required.

A third embodiment provides a polymer represented by Formula C:

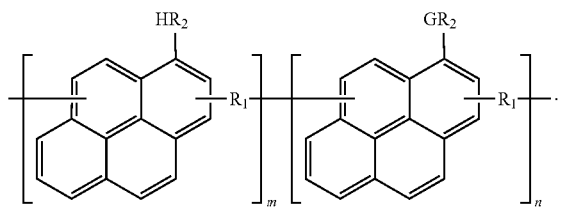

(C)

In Formula C, $R_1$, $R_2$, G, m, and n may be as described in connection with Formula A, i.e., $R_1$ may be methylene or may include a non-pyrene-containing aryl linking group, e.g.,

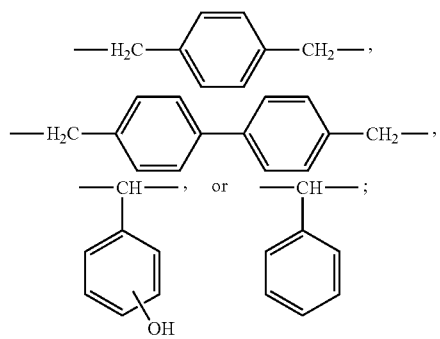

$R_2$ may be an oxygen (—O—) or an alkoxy group having from 1 to about 7 carbons (—$C_nH_{2n}O$—, where n is an integer from 1 to about 7 and 2n represents twice the number of carbons) in which the alkoxy carbon is bonded to the backbone of the polymer and the alkoxy oxygen is bonded to the group G, and $HR_2$ may be the corresponding hydroxyl or alcohol; and G may be a reactive group capable of crosslinking with an adjacent polymer molecule. For example, G may be an unsaturated hydrocarbon group (alkene) such as vinyl ($—CH=CH_2$) or allyl ($—CH_2—CH=CH_2$), in which the unsaturation is at a terminal position. A partial structure showing the case is which G is allyl is shown below:

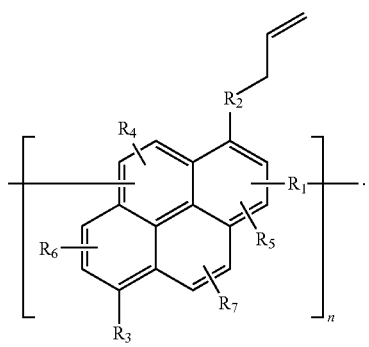

In Formula C, the numbers represented by m and n may be as follows: m may be at least 1 and less than about 750, and n may be at least 1 and less than about 750.

Formula C may be unsubstituted or substituted, e.g., the pyrene group in Formula C may be substituted. In an implementation, the pyrene group may be substituted with one or more of groups $R_3$, $R_4$, $R_5$, $R_6$, and $R_7$, as shown in Formula 3.

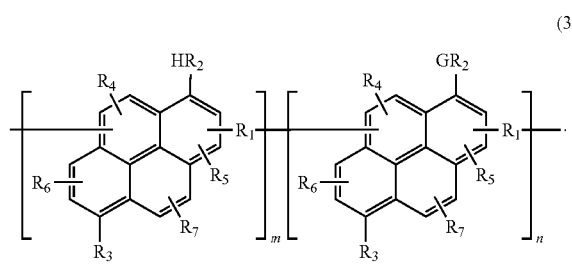

(3)

In Formula 3, the groups $R_3$, $R_4$, and $R_5$ may be as described in connection with Formula 2, i.e., $R_3$, $R_4$, and $R_5$ may independently be a hydroxyl, a halogen, or a hydrocarbon of about 10 carbons or less. The hydrocarbon of about 10 carbons or less may include, e.g., a $C_1$-$C_{10}$ alkyl group, a $C_6$-$C_{10}$ aryl group, or an allyl group. The group $R_6$ may also be a hydroxyl, a halogen, or a hydrocarbon of about 10 carbons or less, and the hydrocarbon of about 10 carbons or less may include, e.g., a $C_1$-$C_{10}$ alkyl group, a $C_6$-$C_{10}$ aryl group, or an allyl group. The group $R_7$ may also be a hydroxyl, a halogen, or a hydrocarbon of about 10 carbons or less, and the hydrocarbon of about 10 carbons or less may include, e.g., a $C_1$-$C_{10}$ alkyl group, a $C_6$-$C_{10}$ aryl group, or an allyl group. That is, $R_3$, $R_4$, $R_5$, $R_6$, and $R_7$ may each independently be a hydroxyl, a halogen, or a hydrocarbon of about 10 carbons or less, and the hydrocarbon of about 10 carbons or less may include, e.g., a $C_1$-$C_{10}$ alkyl group, a $C_6$-$C_{10}$ aryl group, or an allyl group. Further, one or more of $R_3$, $R_4$, $R_5$, $R_6$, and $R_7$ may be hydrogen, i.e., substitution at all of $R_3$, $R_4$, $R_5$, $R_6$, and $R_7$ is not required.

The aromatic ring-containing polymers represented by Formulae A, B, and C may have a number of reactive sites distributed along the backbone chain of the polymer that are capable of crosslinking or reacting with a crosslinker, e.g., $R_3$ to in Formulae 1, 2, and 3 may be hydroxyl groups. The aromatic ring-containing polymers represented by Formulae A, B and C may have a weight average molecular weight of about 1,000 to about 30,000.

An embodiment provides a hardmask composition including at least one of the polymers represented by Formulae A, B, or C. The hardmask composition may further include one or more of an initiator, an organic solvent, a crosslinker, a catalyst, or a surfactant.

In the hardmask composition, the aromatic ring-containing polymers represented by Formulae A, B, and C include aromatic rings in the backbone of the polymers, which may provide strong absorption in the short wavelength region, e.g., 157 nm, 193 nm, and/or 248 nm, such that the hardmask composition absorbs light in the short wavelength region. The hardmask composition may also exhibit film-forming characteristics, which may assist in the formation of a layer by a conventional spin-coating technique. Additionally, the polymers represented by Formulae A, B, and C may have reactive groups G where crosslinking can occur. In the polymers represented by Formulae A, B, and C, the polymers may be random copolymers or block copolymers and, in the synthesis of the polymers, the groups G may be introduced prior to polymerization or following polymerization. The reactive groups may G be, e.g., unsaturated alkyl groups such as allyl and vinyl groups. Thus, an initiator may be used to generate crosslinking between adjacent polymer molecules such that the composition may be cured, e.g., upon baking (heating) following coating of the composition.

The initiator may be a thermal initiator suitable for crosslinking unsaturated alkyl groups of the aromatic ring-containing polymers, e.g., one or more of peroxides, persulfates, azo compounds, etc. The organic solvent may be any suitable solvent that sufficiently dissolves the aromatic ring-containing polymer, e.g., propylene glycol monomethyl ether acetate (PGMEA), propylene glycol monomethyl ether (PGME), cyclohexanone, ethyl lactate, etc.

When the hardmask composition includes the crosslinker and the catalyst, crosslinking may occur between the crosslinker and the reactive sites of the polymer, e.g., where one or more of $R_3$ to $R_7$ are hydroxyl groups, so as to cure the hardmask composition. This may provide the hardmask with enhanced etch and chemical resistance. The crosslinker may be capable of reacting with reactive sites of the aromatic ring-containing polymer in the presence of a catalyst, and may include one or more of, e.g., bisepoxy compounds, etherified amino resins, alkoxyalkyl melamine resins such as N-methoxymethyl-melamine resins and N-butoxymethyl-melamine resins, methylated urea resins, butylated urea resins such as Cymel® U-65 and UFR 80 (manufactured by Cytec Industries, Inc. (U.S.A.)), glycoluril derivatives such as Powderlink® 1174 (manufactured by Cytec Industries, Inc. (U.S.A.) and illustrated in Formula 4, below), 2,6-bis(hydroxymethyl)-p-cresol, etc.

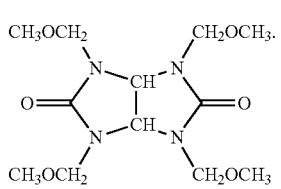

(4)

The catalyst may include one or more of, e.g., ammonium hydroxides such as $NH_4OH$ and $NR_4OH$, where R is alkyl, 2-methylimidazole, p-toluenesulfonic acid monohydrate, pyridinium p-toluenesulfonate, etc. For improved storage stability, a thermal acid generator (TAG) compound, i.e., a compound that generates an acid upon thermal treatment, may be used as the catalyst. Examples of preferred TAGs include pyridinium p-toluenesulfonate, 2,4,4,6-tetrabromocyclohexadienol, benzoin tosylate, 2-nitrobenzyl tosylate, and alkyl esters of organic sulfonic acids. Radiation-sensitive acid catalysts used for resists that are compatible with the other components of the hardmask composition may also be used.

In the hardmask composition, the total amount of the aromatic ring-containing polymer(s) represented by Formulae A, B, and/or C may about 1 part to about 30 parts by weight, based on 100 parts by weight of the organic solvent. When the hardmask composition includes the organic solvent, the initiator, the crosslinker, and the catalyst, the aromatic ring-containing polymer represented by Formulae A, B, and/or C may be about 1% to about 20% of the weight of the composition, preferably about 3% to about 10% of the weight, the initiator may be about 0.001% to about 5% of the weight of the composition, preferably about 0.01% to about 3% of the weight, the organic solvent may be about 75% to about 98.8% of the weight of the composition, the crosslinker may be about 0.1% to about 5% of the weight of the composition, preferably about 0.1% to about 3% of the weight, and the catalyst may be about 0.001% to about 0.05% of the weight of the composition, preferably about 0.001% to about 0.03% of the weight.

Using about 1 part by weight to about 30 parts by weight of the polymer with respect to 100 parts by weight of the organic solvent may help ensure that a desired coating thickness is attained, i.e., that the coating thickness is accurately controlled. Using about 0.001% by weight or more of the initiator may help ensure satisfactory crosslinking, and using about 5% by weight or less may help avoid having excess, i.e., unreacted, initiator, which could cause deformation of a pattern profile and intermixing at the interface with a photoresist or an overlying second hardmask, such that the optical properties of the coated film may vary. Using about 0.1% by weight or more of the crosslinker may help ensure satisfactory crosslinking, and using about 5% by weight or less may help avoid deformation of the pattern profile, and avoid redeposition contamination caused by volatile components that evolve upon baking. Using about 0.001% by weight or more of the catalyst may help ensure satisfactory crosslinking, and using about 0.05% by weight or less may help avoid excess acidity and impart the composition with good storage stability.

Figure 1B:
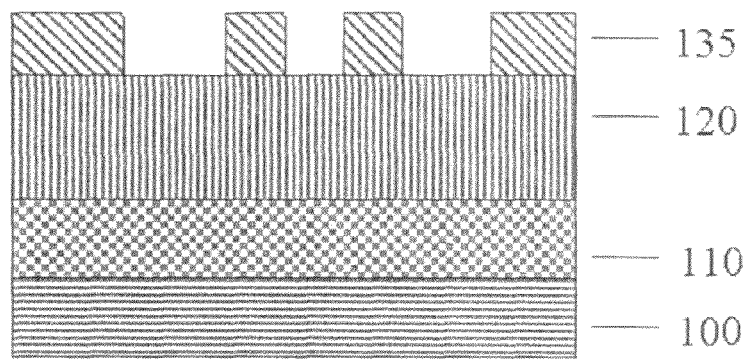
Figure 1C:
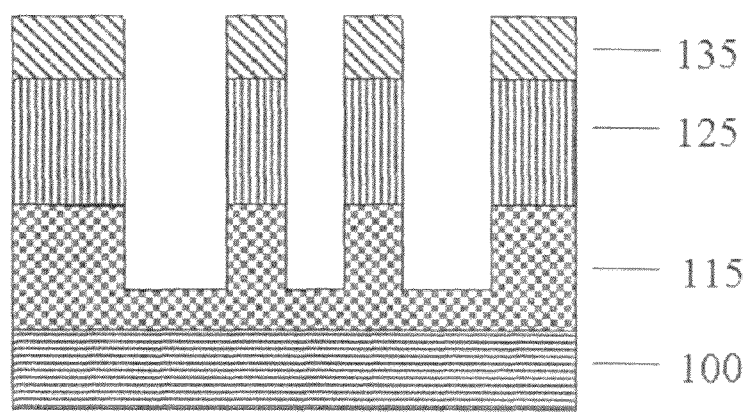

An embodiment provides a process for patterning a material layer on a substrate using the hardmask composition formed on the material layer. The process may include providing a material layer, e.g., a substrate having the material layer thereon, forming a hardmask layer using the composition according to an embodiment on the material layer, forming a radiation-sensitive imaging layer on the hardmask layer, patternwise exposing the imaging layer to radiation to form a pattern of radiation-exposed regions in the imaging layer, selectively removing portions of the imaging layer and the hardmask layer to expose portions of the material layer, and etching the portions of the material layer that are exposed through openings in the hardmask layer to pattern the material layer. For example, referring to FIG. 1A, the process of fabricating a device using a hardmask composition according to an embodiment may include providing a substrate 100 having a target material layer 110, e.g., a metal layer such as aluminum, or a silicon nitride (SiN) layer, forming a hardmask layer 120 on the target material layer 110, and forming an imaging layer 130, e.g., a photoresist layer, on the hardmask layer 120. Referring to FIGS. 1B and 1C, the imaging layer 130 may then be exposed and developed to yield a patterned imaging layer 135, after which the hardmask layer 120 and the target material layer 110 may be sequentially processed to form a hardmask pattern 125 and a patterned material layer 115.

As a particular example, the process may be carried out in accordance with the following procedure. First, a material to be patterned may be applied to a substrate, e.g., a silicon substrate, by a general technique. The material to be patterned may be an electrically conductive, semi-conductive, magnetic, or insulating material, e.g., aluminum, silicon nitride, etc. Thereafter, the hardmask composition according to an embodiment may be spin-coated, e.g., to a thickness of about 500 Å to about 4,000 Å, and baked to form a hardmask layer, e.g., baked at about 100° C. to about 300° C. for about 10 seconds to about 10 minutes. The radiation-sensitive imaging layer may then be formed on the hardmask layer. Exposure and developing of the imaging layer may then be conducted to form openings corresponding to where a pattern is to be formed, i.e., the imaging layer and the hardmask layer may be selectively removed to expose portions of the material layer. The material layer may then be etched, e.g., using dry etching with an etching gas such as a mixed gas of $CHF_3/CF_4$, to form a patterned material layer, with the hardmask serving to protect unexposed portions of the material layer. Thereafter, the remaining portions of the resist may be removed using a common photoresist stripper. The patterned hardmask, i.e., the polymerized composition including one or more crosslinked polymers according to an embodiment, may be removed. A semiconductor integrated circuit device, an optical or electro-optical device, a microelectromechanical system (MEMS) device, etc., may thus be provided.

Figure 1D:
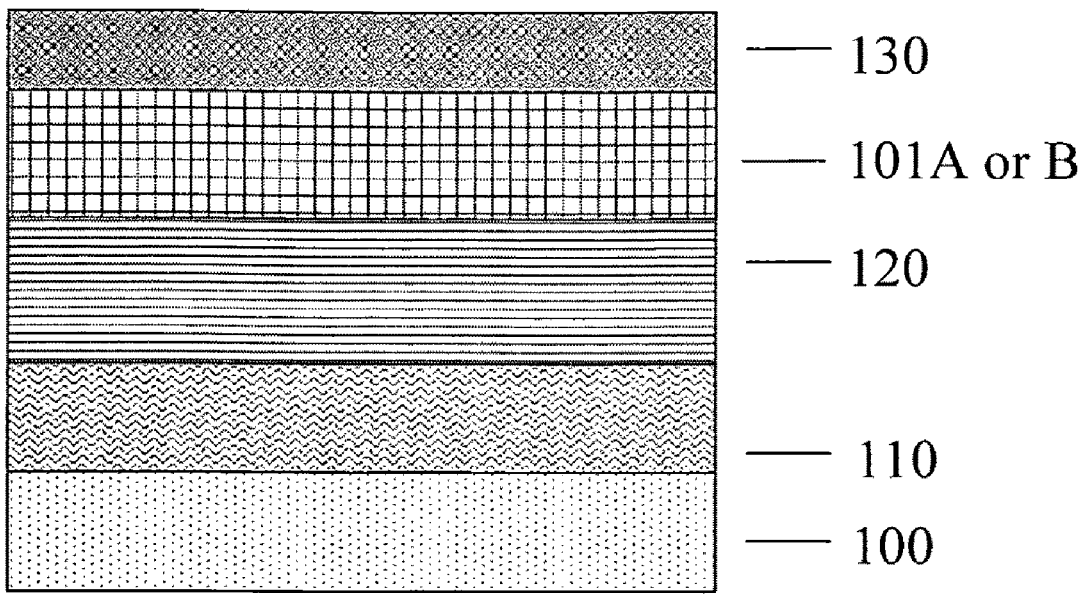
Figure 1E:
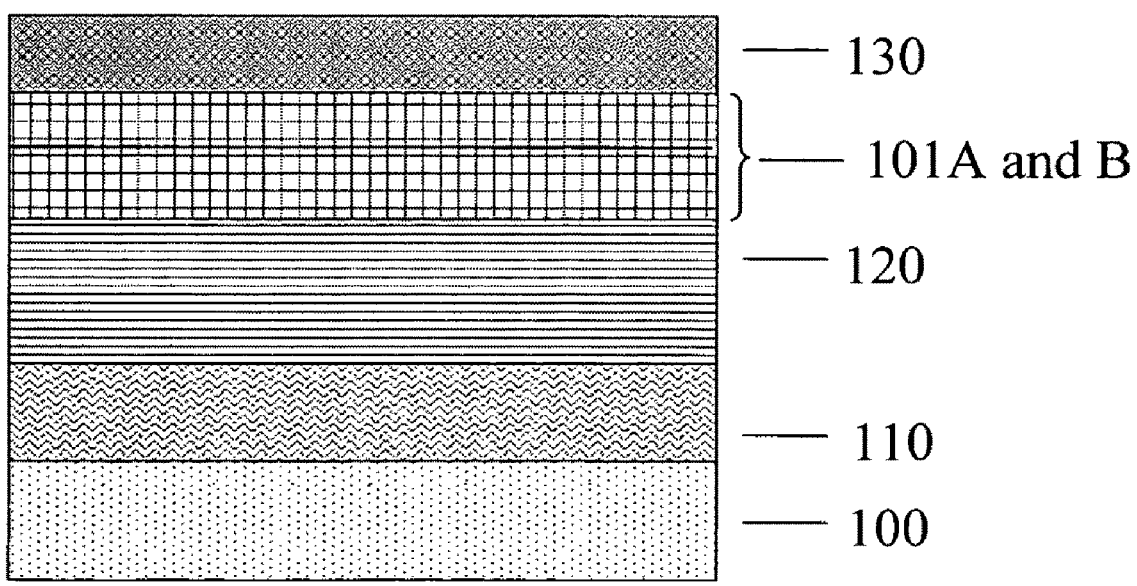

Referring to FIG. 1D, in an implementation, the process may further include forming a silicon-containing hardmask layer 101A or a bottom antireflective hardmask layer (BARC) 101B prior to forming the imaging layer 130, e.g., after forming the hardmask layer 120 according to an embodiment, and prior to forming the imaging layer 130. Referring to FIG. 1E, in an implementation, the bottom antireflective hardmask layer 101B may be formed on the silicon-containing hardmask layer 101A prior to forming the imaging layer 130, e.g., after forming the hardmask layer 120 according to an embodiment, and prior to forming the imaging layer 130.

The hardmask composition and the lithographic structure formed using the composition may be used in the fabrication and design of integrated circuit devices in accordance with general semiconductor manufacturing processes. For example, the composition may be used in the formation of patterned material layer structures such as metal wiring, holes for contacts and biases, insulating sections such as damascene trenches and shallow trench isolation (STI) structures, trenches for capacitor structures, etc.

The following Examples and Comparative Examples are provided in order to set forth particular details of one or more embodiments. However, it will be understood that the embodiments are not limited to the particular details described.

EXAMPLES

Synthesis Example 1

Synthesis of Polymer of 4,4'-(9-fluorenylidene)divinylphenol and 1,4-bis(methoxymethyl)benzene, and Reaction of the Polymer with Allyl Chloride 445.58 g of 4,4'-(9-fluorenylidene)divinylphenol, 3.08 g of diethyl sulfate and 350 g of propylene glycol monomethyl ether were completely dissolved with stirring in a 3 L three-neck flask, equipped with a mechanical agitator and a condenser, while maintaining the temperature of the reactor at 130° C. 10 minutes after the dissolution, 116.35 g of 1,4-bis(methoxymethyl)benzene was added dropwise to the solution, and then the resulting mixture was allowed to react at the same temperature for 15 hours. 2.98 g of triethanolamine was then added as a neutralizing agent to quench the reaction. After completion of the reaction, acid was removed from the reaction using a mixture of water and methanol, and low-molecular weight compounds, e.g., oligomers and monomers, were removed using methanol to yield a polymer represented by Formula 5 ($M_w$=10,000, polydispersity=1.8, n=20).

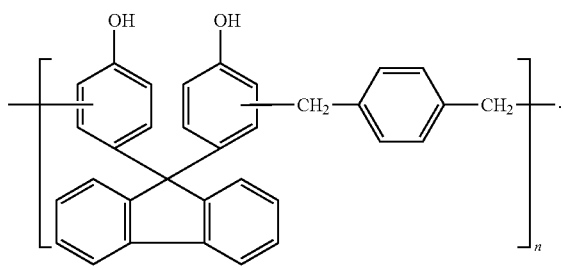

(5)

The polymer represented by Formula 5 was then functionalized to introduce allyl groups. 470.60 g of the polymer of Formula 5, 38.26 g of allyl chloride, 34.55 g of potassium carbonate and 500 g of acetone were put into a 2 L three-neck flask equipped with a condenser. The mixture was refluxed for 12 hours. After completion of the reaction, the base and unreacted allyl chloride were removed using a water/methanol mixture, yielding a polymer represented by Formula 6 ($M_w$=11,000, polydispersity=1.8, n+m=20).

Synthesis Example 2

Synthesis of Polymer of 1-Naphthol and Paraformaldehyde, and Reaction of the Polymer with Allyl Chloride The procedure of Synthesis Example 1 was repeated, except that 144.17 g of 1-naphthol and 30.03 g of paraformaldehyde were used instead of 445.58 g of 4,4'-(9-fluorenylidene)divinylphenol and 166.22 g of 1,4-bis(methoxymethyl)benzene, to yield the polymer of Formula 7.

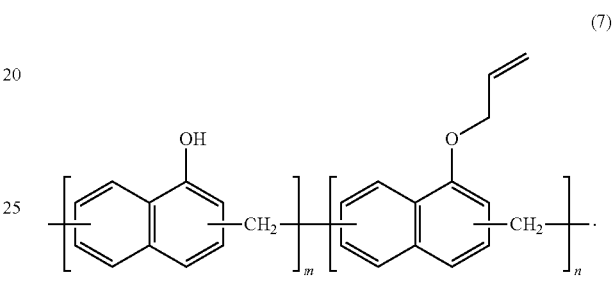

(7)

The molecular weight and the polydispersity of the polymer were measured by gel permeation chromatography (GPC) in tetrahydrofuran, and were determined to be $M_w$=10,000, n+m=20, and polydispersity=2.2.

Synthesis Example 3

Synthesis of Polymer of 1-Pyrenol and Paraformaldehyde, and Reaction of the Polymer with Allyl Chloride The procedure of Synthesis Example 1 was repeated, except that 218.25 g of 1-pyrenol and 30.03 g of paraformaldehyde were used instead of 445.58 g of 4,4'-(9-fluorenylidene)divinylphenol and 166.22 g of 1,4-bis(methoxymethyl)benzene, to yield the polymer of Formula 8.

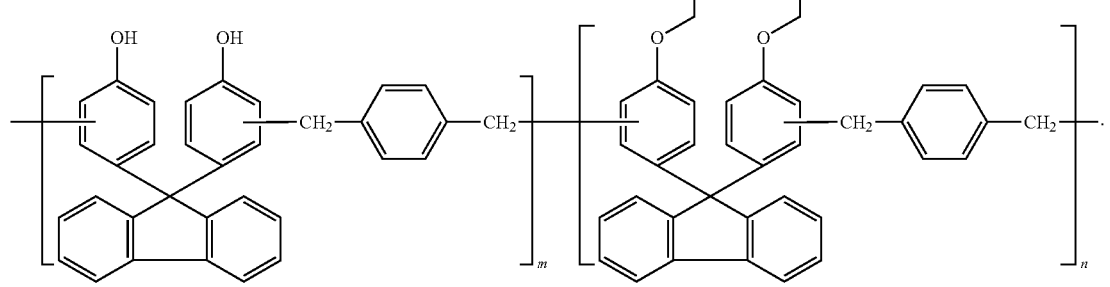

(6)

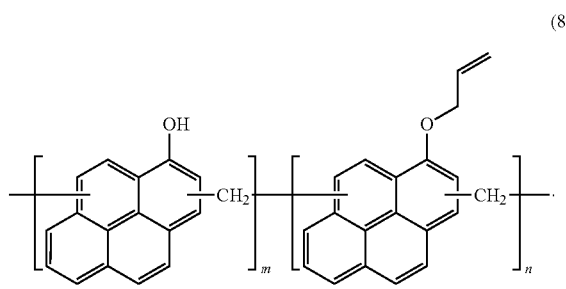

(8)

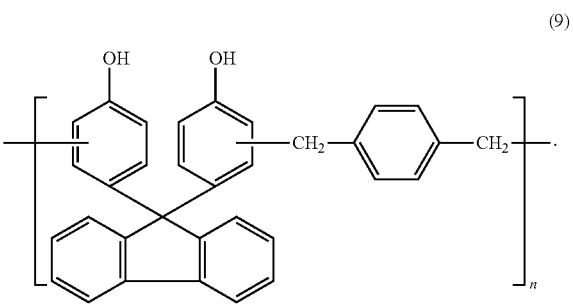

(9)

The molecular weight and the polydispersity of the polymer were measured by gel permeation chromatography (GPC) in tetrahydrofuran, and were determined to be $M_w$=12,000, n+m=20, and polydispersity=2.3.

Examples 1 to 3

Respective compositions were formed using 0.8 g of functionalized polymer, as prepared in Synthesis Examples 1 to 3, 0.08 g of 2,2'-azobisisobutyronitrile (AIBN) as an initiator, 0.2 g of crosslinking agent Powderlink® 1174, and 2 mg of pyridinium p-toluene sulfonate, which were dissolved in 9 g of propylene glycol monomethyl ether acetate (PGMEA) and filtered. The compositions were spin-coated on silicon wafers, followed by baking at 200° C. for 60 seconds to form respective 4,000 Å thick films. The refractive index (n) and extinction coefficient (k) of the films were measured using an ellipsometer (J. A. Woollam Co., Inc. (U.S.A.)). The results are shown in Table 1, and indicate that the films each had a refractive index and an absorbance suitable for use as an antireflective film at wavelengths of 193 nm (ArF) and 248 nm (KrF).

Synthesis Example 4

Synthesis of Polymer of
9,9-bis(hydroxyphenyl)fluorene and
1,4-bis(methoxymethyl)benzene 350.41 g of 9,9-bis(hydroxyphenyl)fluorene, 3.08 g of diethyl sulfate and 350 g of propylene glycol monomethyl ether acetate were completely dissolved with stirring in a 3 liter four-neck flask, equipped with a mechanical agitator and a condenser, while maintaining the temperature of the reactor at 115° C. 10 minutes after the dissolution, 116.35 g of 1,4-bis(methoxymethyl)benzene was added dropwise to the solution, and then the resulting mixture was allowed to react at the same temperature for 15 hours. 2.98 g of triethanolamine was then added as a neutralizing agent to quench the reaction. After completion of the reaction, acid was removed from the reaction using a mixture of water and methanol, and low-molecular weight compounds, e.g., oligomers and monomers, were removed using methanol to yield a polymer represented by Formula 9 ($M_w$=10,000, polydispersity=2.0, n=20).

Comparative Example 1

A film was formed in the same manner as in Examples 1 to 3, except that the polymer prepared in Synthesis Example 4 was used. The film was measured for refractive index (n) and extinction coefficient (k). The results are also shown in Table 1.

TABLE 1

| | Optical properties (193 nm) | | Optical properties (248 nm) | |
|---|---|---|---|---|
| | Refractive index (n) | Extinction coefficient (k) | Refractive index (n) | Extinction coefficient (k) |
| Example 1 | 1.47 | 0.65 | 1.90 | 0.20 |
| Example 2 | 1.43 | 0.60 | 2.11 | 0.28 |
| Example 3 | 1.44 | 0.71 | 1.80 | 0.26 |
| Comparative Example 1 | 1.45 | 0.74 | 1.94 | 0.28 |

Examples 4 to 6

Each of the compositions prepared in Examples 1, 2, and 3 was spin-coated on a silicon wafer covered with silicon nitride and baked at 200° C. for 60 seconds to form a 4,000 Å thick film. A silicon antireflective coating (ARC) was formed on the film and baked at 240° C. for 60 seconds. Thereafter, an ArF photoresist was coated to a thickness of 1,700 Å on the silicon ARC, baked at 110° C. for 60 seconds, exposed to light using an ArF exposure system (ASML Netherlands B.V., XT: 1400, NA 0.93), and developed with an aqueous solution of TMAH (2.38 wt %) to form a 63-nm line and space pattern. The patterns were observed using a field emission scanning electron microscope (FE-SEM). The patterns were measured for exposure latitude (EL) margin as a function of exposure energy and depth of focus (DoF) margin as a function of the distance from a light source. The results are shown in Table 2.

Comparative Example 2

A pattern was formed in the same manner as in Examples 4 to 6, except that the composition prepared in Comparative Example 1 was used. The profile of the pattern was observed, and was measured for exposure latitude (EL) and depth of focus (DoF). The results are also shown in Table 2. There was no significant difference in pattern profile and margins between the patterns formed in Examples 4 to 6 and in Comparative Example 2.

TABLE 2

| | Pattern properties | | |
|---|---|---|---|
| | EL margin (Δ mJ/ exposure energy mJ) | DoF margin (μm) | Profile |
| Example 4 | 4 | 0.25 | cubic |
| Example 5 | 4 | 0.25 | cubic |
| Example 6 | 4 | 0.25 | cubic |
| Comparative Example 2 | 4 | 0.25 | cubic |

Examples 7 to 9

Each of the silicon ARCs of the patterned specimens, i.e., Examples 4 to 6, was dry-etched using a mixed gas of $CHF_3/CF_4$ through a photoresist as a mask. The hardmask was dry-etched using a mixed gas of $O_2/N_2$ through the silicon ARC as a mask. Thereafter, the silicon nitride underlying the hardmask was dry-etched using a mixed gas of $CHF_3/CF_4$, using the hardmask as a mask. $O_2$ ashing and wet stripping were performed on the remaining portions of the hardmask and the organic material. Immediately after etching of the hardmask and the silicon nitride, the cross-sections of the specimens were observed using an FE-SEM. The results are shown in Table 3. The etched patterns all showed good profiles in the silicon nitride, which is believed to be because the hardmasks according to embodiments were sufficiently resistant to the etching gas.

Comparative Example 3

The specimen formed in Comparative Example 2 was etched to form a pattern in accordance with the procedure described in connection with Examples 7 to 9. The pattern was observed, and the results are also shown in Table 3. The pattern showed an isotropic (bowed) etching profile after etching of the hardmask. The isotropic etching profile is believed to cause tapering of the pattern upon etching of the silicon nitride.

TABLE 3

| Sample used in the formation of film | Pattern shape after etching of hardmask | Pattern shape after etching of silicon nitride |
|---|---|---|
| Example 7 | Vertical (Anisotropic) | Vertical (Anisotropic) |
| Example 8 | Vertical (Anisotropic) | Vertical (Anisotropic) |
| Example 9 | Vertical (Anisotropic) | Vertical (Anisotropic) |
| Comparative Example 3 | Bowed | Tapered |

The polymer and hardmask composition according to embodiments may be used in lithography, and may provide excellent optical and mechanical properties. As described above, the hardmask composition may be used to form a film having a refractive index and an absorbance suitable for use as an antireflective film in the deep UV (DUV) region, e.g., 193 nm (ArF) and/or 248 nm (KrF), and may significantly reduce reflectivity between a resist and an underlying layer. The hardmask composition may be used to provide a lithographic structure with good pattern profiles and process margins. The composition according to an embodiment may be highly resistant to dry etching, may exhibit high etch selectivity, may be resistant to multiple etching operations during lithography, and may be used to form a hardmask having a very good etch profile. Therefore, the composition may be used to provide a multilayer thin film that is patterned with high aspect ratio, and a good image may be transferred to an underlying layer. In addition, the composition may be readily applied by spin-on application techniques.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A bis(phenyl)fluorene-backbone polymer represented by Formula A:

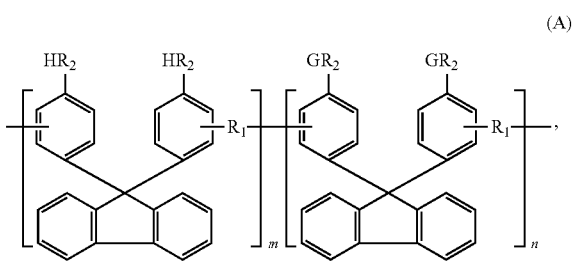

(A)

wherein:
the fluorene group is unsubstituted or substituted,
m is at least 1 and is less than about 750,
n is at least 1 and is less than about 750,
$R_1$ is

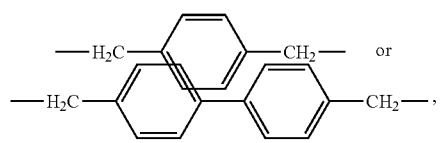

$R_2$ is oxygen or an alkoxy group having from 1 to about 7 carbons in which the alkoxy oxygen is bonded to the hydrogen H or the group G, and
G is vinyl or allyl.

2. The polymer as claimed in claim 1, wherein the fluorene group is substituted, such that Formula A is represented by Formula 1:

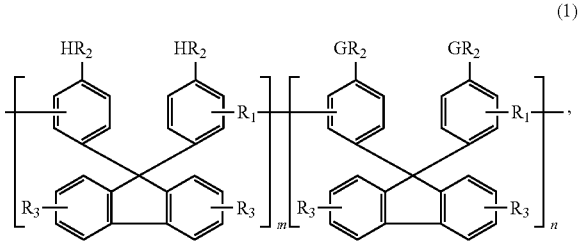

(1)

wherein:
$R_3$ is a hydroxyl, a hydrocarbon of about 10 carbons or less, or a halogen.

3. The polymer as claimed in claim 2, wherein:
$R_3$ is the hydrocarbon of about 10 carbons or less, and
the hydrocarbon of about 10 carbons or less includes a $C_1$-$C_{10}$ alkyl group, a $C_6$-$C_{10}$ aryl group, or an allyl group.

4. The polymer as claimed in claim 1, wherein the polymer has a weight average molecular weight of about 1,000 to about 30,000.

5. The polymer as claimed in claim 1, wherein Formula A is represented by Formula 6:

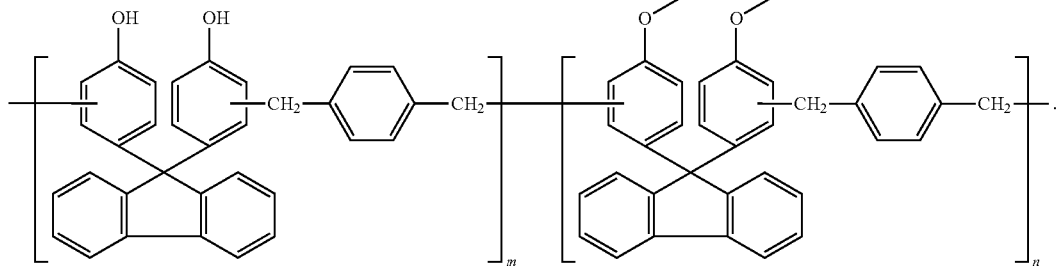

(6)

6. An antireflective hardmask composition, comprising:
an organic solvent;
an initiator; and
a polymer represented by Formula A;

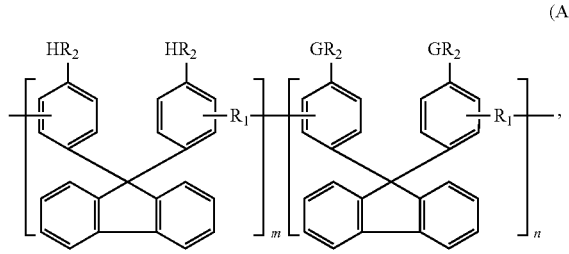

(A)

wherein:
in Formula A, the fluorene group is unsubstituted or substituted,
m is at least 1 and is less than about 750,
n is at least 1 and is less than about 750,
$R_1$ is

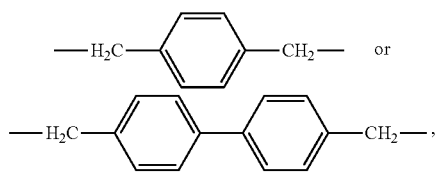

$R_2$ is oxygen or an alkoxy group having from 1 to about 7 carbons in which the alkoxy oxygen is bonded to the hydrogen H or the group G, and
G is vinyl or allyl.

7. The composition as claimed in claim 6, wherein the composition includes about 1 part to about 30 parts by weight of the polymer, based on 100 parts by weight of the organic solvent.

8. The composition as claimed in claim 6, further comprising a crosslinker and a catalyst, wherein:
about 1% to about 20% of the weight of the composition is the polymer,
about 0.001% to about 5% of the weight of the composition is the initiator,
about 75% to about 98.8% of the weight of the composition is the organic solvent,
about 0.1% to about 5% of the weight of the composition is the crosslinker, and
about 0.001% to about 0.05% of the weight of the composition is the catalyst.

9. The composition as claimed in claim 6, further comprising a crosslinker, wherein the crosslinker includes one or more of an etherified amino resin, an N-methoxymethyl-melamine resin, an N-butoxymethyl-melamine resin, a methylated urea resin, a butylated urea resin, a glycoluril derivative, a 2,6-bis(hydroxymethyl)-p-cresol compound, or a bisepoxy compound.

10. A process of patterning a material layer, the process comprising:
forming a hardmask layer on the material layer using the composition according to claim 6;
forming a radiation-sensitive imaging layer on the hardmask layer;
patternwise exposing the imaging layer to radiation to form a pattern of radiation-exposed regions in the imaging layer;
selectively removing portions of the imaging layer and the hardmask layer to expose portions of the material layer; and
etching the portions of the material layer that are exposed through openings in the hardmask layer.

* * * * *